United States Patent
Tsukiji et al.

(10) Patent No.: US 6,921,677 B2
(45) Date of Patent: Jul. 26, 2005

(54) METHOD OF MANUFACTURING SEMICONDUCTOR ELEMENT, AND SEMICONDUCTOR ELEMENT MANUFACTURED WITH THIS METHOD

(75) Inventors: Naoki Tsukiji, Tokyo (JP); Satoshi Irino, Tokyo (JP)

(73) Assignee: The Furukawa Electric Co., LTD., Tokyo (JP)

( * ) Notice: Subject to any disclaimer, the term of this patent is extended or adjusted under 35 U.S.C. 154(b) by 25 days.

(21) Appl. No.: 10/014,507

(22) Filed: Dec. 14, 2001

(65) Prior Publication Data

US 2003/0008428 A1 Jan. 9, 2003

(30) Foreign Application Priority Data

Jul. 6, 2001 (JP) ........................................ 2001-206994

(51) Int. Cl.$^7$ ................................................ H01L 21/00
(52) U.S. Cl. .............................. 438/33; 438/38; 438/29
(58) Field of Search ............................. 438/33, 38, 29, 438/42, 44, 68, 460, 462, 289, 292; 372/50, 46, 27, 97, 45, 26, 348, 49, 20, 28, 32, 96, 98, 99, 100, 101, 102; 359/344, 333

(56) References Cited

U.S. PATENT DOCUMENTS

| | | | | |
|---|---|---|---|---|
| 5,180,685 A | * | 1/1993 | Yamamoto et al. | 438/33 |
| 5,260,231 A | * | 11/1993 | Kawanishi et al. | 438/38 |
| 5,352,919 A | * | 10/1994 | Takano | 257/431 |
| 5,392,308 A | * | 2/1995 | Welch et al. | 372/92 |
| 5,537,432 A | * | 7/1996 | Mehuys et al. | 372/50 |
| 5,602,864 A | * | 2/1997 | Welch et al. | 372/50 |
| 5,651,018 A | * | 7/1997 | Mehuys et al. | 372/50 |
| 5,822,352 A | * | 10/1998 | Mizutani et al. | 372/50 |
| 5,864,574 A | * | 1/1999 | Welch et al. | 372/50 |
| 5,981,307 A | | 11/1999 | Matsuda | |
| 6,008,675 A | * | 12/1999 | Handa | 327/96 |
| 6,075,799 A | * | 6/2000 | Uchida et al. | 372/27 |
| 6,111,906 A | * | 8/2000 | Muroya | 372/96 |
| RE37,354 E | * | 9/2001 | Welch et al. | 372/50 |
| 6,384,963 B2 | | 5/2002 | Ackerman et al. | |
| 6,501,777 B1 | * | 12/2002 | Sato | 372/45 |
| 6,577,660 B1 | * | 6/2003 | Muroya | 372/45 |
| 6,707,836 B2 | * | 3/2004 | Orita et al. | 372/50 |
| 2001/0005391 A1 | | 6/2001 | Sakata | |

* cited by examiner

*Primary Examiner*—Laura M Schillinger
(74) *Attorney, Agent, or Firm*—Oblon, Spivak, McClelland, Maier & Neustadt, P.C.

(57) ABSTRACT

When manufacturing semiconductor elements, a group of semiconductor elements having a diffraction grating formed partly on the side of the facet from which laser light is emitted is formed collectively on a semiconductor wafer by using semiconductor process technologies. The semiconductor laser elements are arranged such that the light emitting facets are opposite to each other to thereby form each diffraction grating of the semiconductor laser elements arranged opposite to each other as one diffraction grating, cleaving this diffraction grating at respective cleavage planes to cut out laser bars, followed by the cleavage of cleavage planes to cut out semiconductor laser elements.

8 Claims, 13 Drawing Sheets

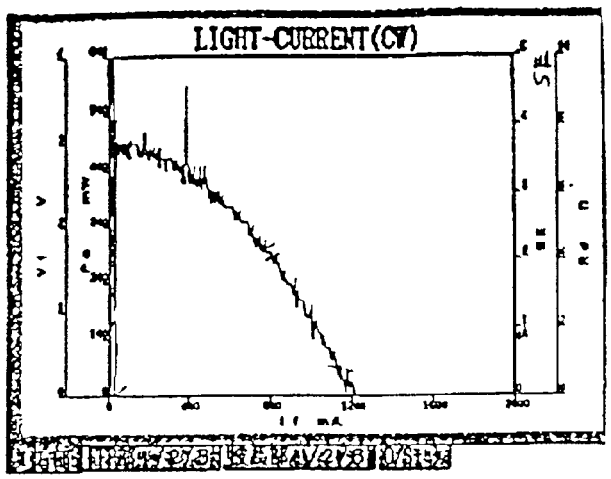
3A
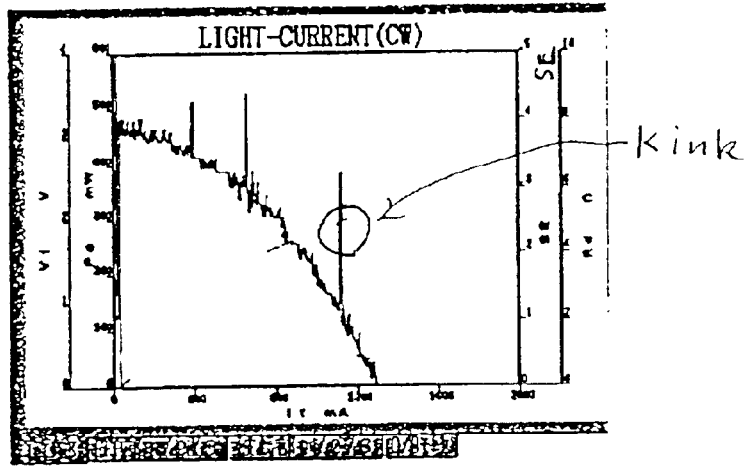
3B
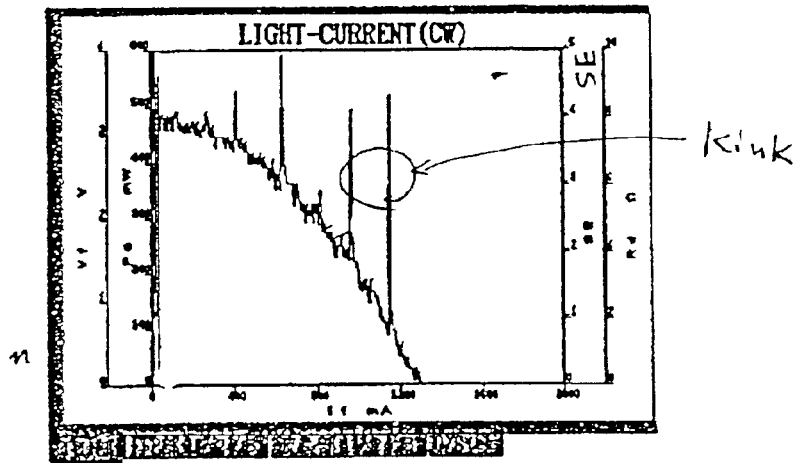
3C

METHOD OF MANUFACTURING SEMICONDUCTOR ELEMENT, AND SEMICONDUCTOR ELEMENT MANUFACTURED WITH THIS METHOD

FIELD OF THE INVENTION

The present invention relates to a method of manufacturing semiconductor elements having a diffraction grating and semiconductor element/s manufactured with this method.

BACKGROUND OF THE INVENTION

Current semiconductor laser elements or the like are formed collectively on a compound semiconductor substrate and thereafter each semiconductor laser element is cut out by cleavage. Each semiconductor laser element formed in this manner has the same structure. In this case, semiconductor laser elements in which diffraction gratings or the like are partly formed on the side of the end from which laser light is emitted are formed in a matrix form that each diffraction grating is arranged uniformly in the same direction on the semiconductor substrate 1 as shown in FIG. 11.

In each semiconductor laser element, a clad layer and an active layer of a semiconductor laser element are formed using semiconductor process technologies. After that, in FIG. 11, these semiconductor lasers are first cleft through cleavage planes C11 to C14 to form laser bar LB11 to LB13. Each cleavage plane of each of these laser bars LB11 to LB13 is subjected to coating to form a reflecting film and an emitting film collectively. Then, the laser bars LB11 to LB13 on which the reflecting film and the emitting film are formed are cleft every each of laser bars LB11 and LB13 corresponding to cleavage planes C21 to C24 to cut out a semiconductor laser element LD10 finally. For example, each semiconductor laser element is cut out as semiconductor laser elements LD11 and LD13.

FIG. 12 is a view showing a section along the line B—B corresponding to the cleavage plane C22 before the laser bars LB11 and LB12 are cleft and the section after cleft. As shown in FIG. 12, the laser bar LB11 is cut out by the cleavage of the cleavage planes C11 and C12 and the laser bar LB12 is cut out by the cleavage of the cleavage planes C12 and C13. Here, the cleavage plane C11 forms at least a reflecting surface HR11 of each semiconductor laser element forming the laser bar LB11. Also, the cleavage plane C12 forms an emitting surface AR11 of the laser bar LB11 and also a reflecting surface HR12 of the laser bar LB12. Further, the cleavage plane C13 forms at least an emitting surface AR12 of the laser bar LB12.

In the semiconductor laser element LD11 formed in the laser bar LB11, a diffraction grating G11 is formed on the side of the emitting surface AR11 and in the semiconductor laser element LD12 formed in the laser bar LB12, a diffraction grating G12 is formed on the side of the emitting surface AR12. The position of each of the diffraction gratings G11 and G12 is aligned with high accuracy on the basis of a pattern of a mask aligner aligned based on an orientation flat OF by using semiconductor process technologies. On the other hand, the cleavage planes C11 to C14 and C21 to C24 are also cleft one after another by a scriber after scratches are formed at positions corresponding to the cleavage planes C11 to C14 on a part of the semiconductor substrate 1 by using a diamond cutter.

However, the aforementioned cleavage planes C11 to C14 are not always cleft along a straight line but there is a case where a misregistration of the order of μm arises depending on the type of crystal surface. Also, though the surface of the orientation flat OF is formed with high accuracy by polishing, there is a case where an angle misregistration of, for example, ±0.05 degree arises. In this case, the misregistration of the cleavage planes C11 to C14 arises resultantly. Also, a misregistration of the order of μm arises due to the effect of the warpage of a semiconductor wafer during the course of mask alignment.

When such a misregistration of the cleavage planes C11 to C14 arises, misregistrations of the diffraction gratings relative to the semiconductor laser elements LD11 and LD12 arise in the semiconductor laser elements LD11 and LD12 as shown in FIG. 13 and FIG. 14. In FIG. 13, actual cleavage planes C11' to C13' are shifted towards the orientation flat OF side from the proper cleavage planes C11 to C13 (shifted to the left side on the figure). Specifically, the cleavage planes C11 to C13 are shifted to positions which encroach upon the inside of each of the diffraction gratings G11 and G12. As a result, in the semiconductor laser elements LD11' and LD12' corresponding to the semiconductor laser elements LD11 and LD12, diffraction gratings G11' and G12' having shorter lengths of diffraction gratings than those of diffraction gratings G11 and G12 are formed and diffraction gratings g11 and g12 which are parts of the diffraction gratings G10 and G11 adjacent to the side of the reflecting film are formed.

In FIG. 14, actual cleavage planes C11" to C13" are shifted from the proper cleavage planes C11 to C13 respectively to the side opposite to the orientation flat OF (shifted to right side on the figure). Specifically, the cleavage planes C11 to C13 are shifted to positions apart from each of the diffraction gratings G11 and G12. As a result, in semiconductor laser elements LD11" and LD12" corresponding to the semiconductor laser elements LD11 and LD12, a space where no diffraction grating is formed between the facets of the emission sides and emission films of the diffraction gratings G11 and G12 is produced.

From these results, in the manufactured semiconductor laser elements, a diffraction grating having a desired diffraction grating length is not formed but unnecessary diffraction gratings are formed or diffraction gratings are not placed on desired positions, giving rise to the problem that there is the case where neither desired oscillation wavelength nor desired laser output can be obtained, causing reduced yields.

It is to be noted that the shifts of the cleavage planes C11 and C13 are not limited to the shifts in the same direction and there is the case where cleavage planes C11 to C13 are individually shifted independently. Also, there is the case where no straight cleavage plane is formed during the course of cleavage so that each of the cleavage planes C11 to C13 itself is shifted depending on the crystal plane.

SUMMARY OF THE INVENTION

It is an object of the present invention to provide a method of manufacturing a semiconductor element in which it is possible to manufacture semiconductor element/s having a common structural portion such as a diffraction grating, which is self-contained in a semiconductor laser element, on a cleavage plane in high yield.

The method of manufacturing a semiconductor element according to one aspect of this invention comprises the steps of collectively forming a group of semiconductor elements having a common structure at one end of each group of semiconductor elements on a semiconductor substrate by using semiconductor process technologies; and forming a common structure wherein said one ends having a common structure are disposed so as to be opposite to each other to form each common structure of the semiconductor elements as a united one common structure.

The method of manufacturing a semiconductor element according to another aspect of this invention comprises the steps of collectively forming a group of semiconductor elements having a common structure at one end of each group of semiconductor elements on a semiconductor substrate by using semiconductor process technologies; and forming an allowance wherein one end of each semiconductor element, which end is provided with said common structure, is arranged in the same direction and an allowance zone is formed, the allowance zone being disposed between the arranged one end of the semiconductor element and the other end of a semiconductor element adjacent to the one end and prepared by extending at least said common structure by a width corresponding to a cutting error of the edge of the one end from the one end and by extending at least the structure of said other end by a width corresponding to a cutting error of the edge of the other end from the other end.

The method of manufacturing a semiconductor element according to still another aspect of this invention comprises the steps of collectively forming a group of semiconductor laser elements having a diffraction grating provided partly on the side of the laser light emitting facet on a semiconductor substrate by using semiconductor process technologies; and forming a diffraction grating wherein said light emitting facet of each semiconductor laser element provided with said diffraction grating is arranged so as to be opposite to each other and each opposite diffraction grating of the semiconductor laser elements is formed as a united one diffraction grating.

The method of manufacturing a semiconductor element according to still another aspect of this invention comprises the steps of collectively forming a group of semiconductor laser elements having a diffraction grating provided partly on the side of the laser light emitting facet on a semiconductor substrate by using semiconductor process technologies; and forming a diffraction grating wherein said light reflecting facet of each semiconductor laser element provided with said diffraction grating is arranged so as to be opposite to each other and each opposite diffraction grating of the semiconductor laser elements is formed as a united one diffraction grating.

The method of manufacturing a semiconductor element according to still another aspect of this invention comprises the steps of collectively forming a group of semiconductor laser elements having a diffraction grating provided partly on both the side of the laser light emitting facet and the side of the laser light reflecting facet on a semiconductor substrate by using semiconductor process technologies; and forming a diffraction grating wherein said light emitting facet and light reflecting facet of each semiconductor laser element provided with said diffraction gratings are arranged so as to be opposite to each other among light emitting facet and among light reflecting facets and each opposite diffraction gratings of the semiconductor laser elements are formed as united one diffraction gratings respectively.

Other objects and features of this invention will become apparent from the following description with reference to the accompanying drawings.

BRIEF DESCRIPTION OF THE DRAWINGS

FIGS. 3A–3C show slope efficiency curves for laser devices having the grating material positioned at different distances from the light emitting facet;

DESCRIPTION OF THE PREFERRED EMBODIMENTS

Embodiments of a method of manufacturing a semiconductor element and a semiconductor element according to the present invention will be hereinafter explained with reference to the accompanying drawings.

Figure 1:
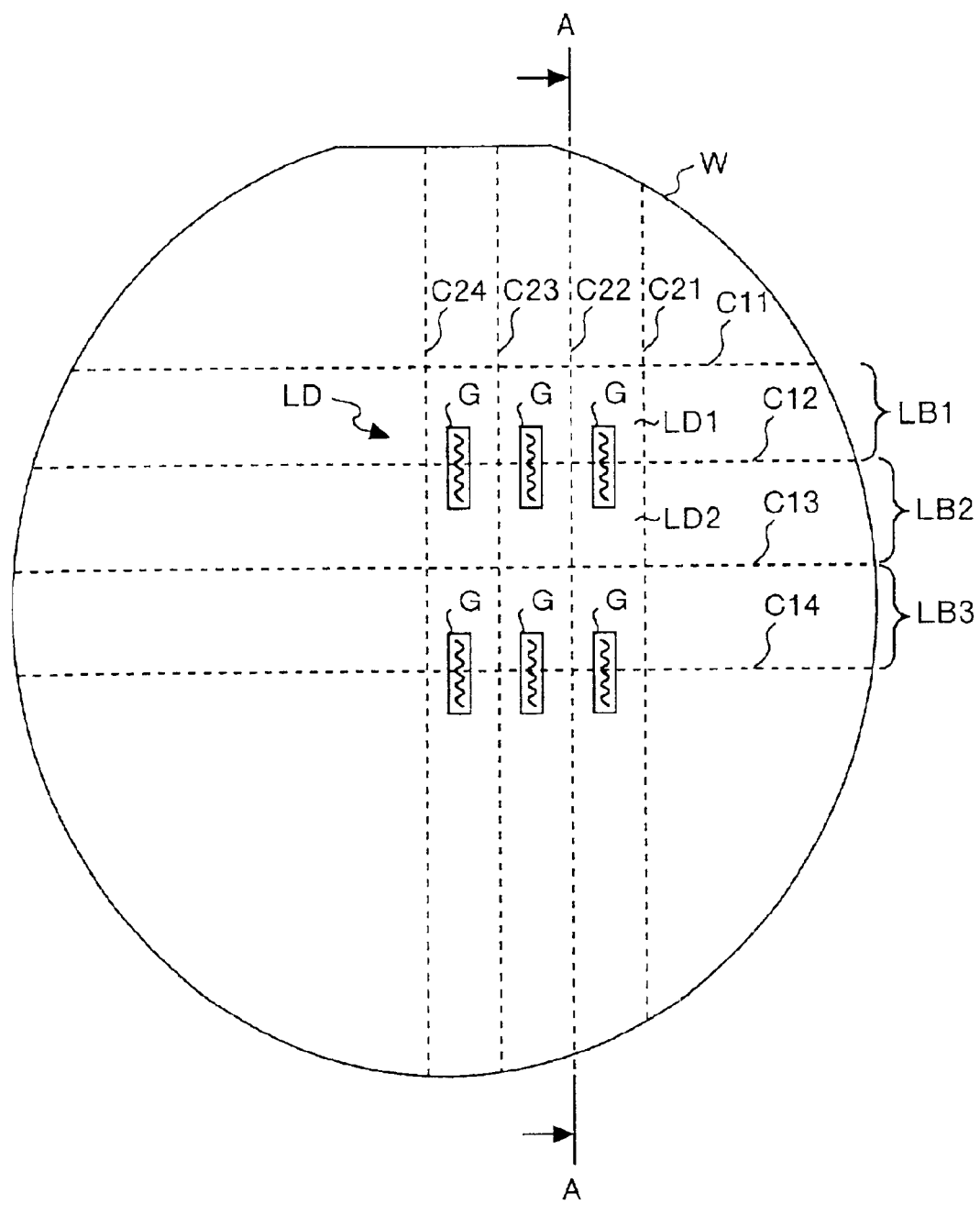
FIG. 1 is a plan view of a semiconductor wafer on which semiconductor laser elements of a first embodiment of this invention are formed.

To begin with, a first embodiment of this invention will be explained. FIG. 1 is a plan view of a semiconductor wafer on which semiconductor laser elements of the first embodiment of the present invention are formed collectively. In FIG. 1, a group LD of semiconductor elements comprising semiconductor laser elements LD1 and LD2 and formed on a semiconductor wafer W is a group of InP type semiconductor laser elements and uses an n-InP compound semiconductor as a substrate. Each semiconductor laser element has a structure shown in FIG. 2 to FIG. 4 (refer to Japanese Patent Application No. 2001-134545)

Figure 2:
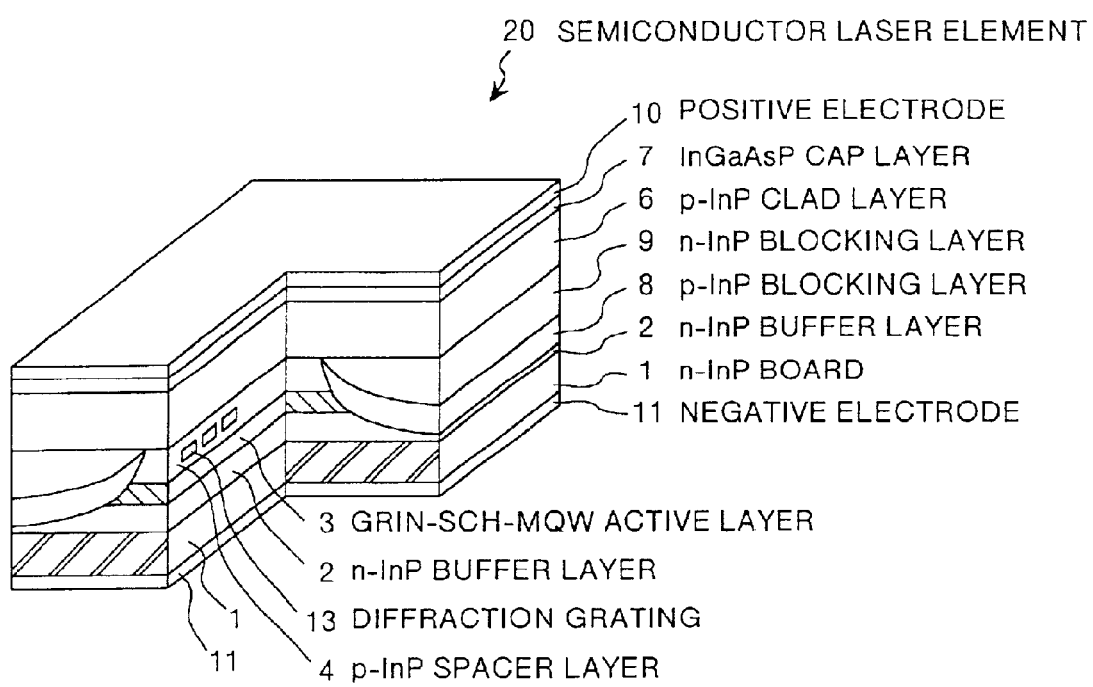
FIG. 2 is a broken-out view showing the structure of a semiconductor laser element cut out from the semiconductor wafer shown in FIG. 1 as viewed from a slanting direction.
Figure 3:
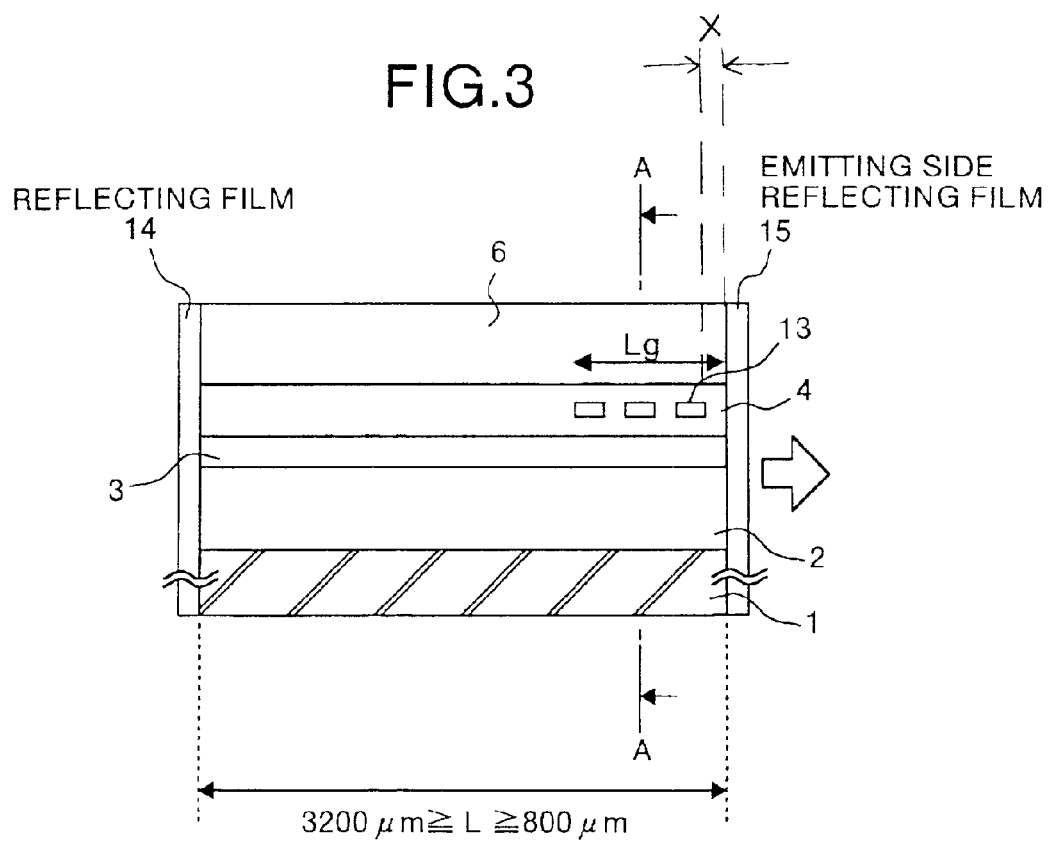
FIG. 3 is a longitudinal sectional view in the direction of the long side of the semiconductor laser element shown in FIG. 2 showing the outline of the structure of the semiconductor laser element.
Figure 4:
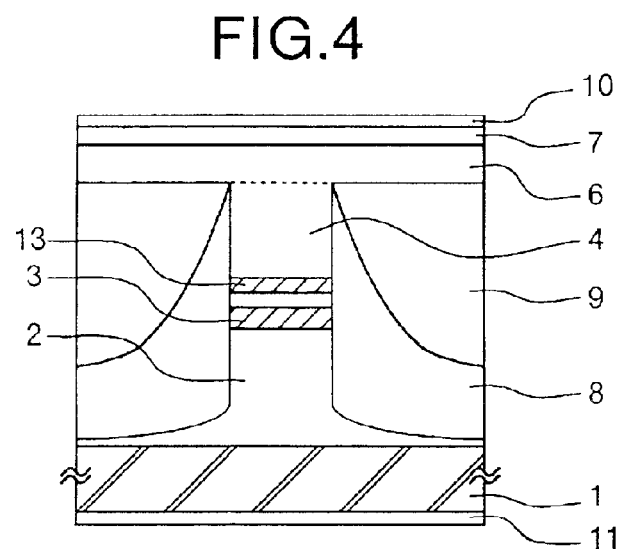
FIG. 4 is a sectional view of the semiconductor laser element along the line A—A of FIG. 2.

FIG. 2 is a broken-out surface showing the structure of the semiconductor laser element shown in FIG. 1 as viewed from a slanting direction. Also, FIG. 3 is a longitudinal sectional view in the direction of the long side of the semiconductor laser element shown in FIG. 2. Further, FIG. 4 is a sectional view of the semiconductor laser element along the line A—A of FIG. 2. In FIG. 2 to FIG. 4, this semiconductor laser element 20 has a structure in which an n-InP buffer layer 2 doubling as an n-INP buffer layer and an under clad layer, a GRIN-SCH-MQW (Graded Index-Separate Confinement Heterostructure Multi Quantum Well) active layer 3 having compressive strain, a p-InP spacer layer 4, a p-InP clad layer 6 and an InGaAsP cap layer 7 are laminated in this order on the surface of an n-InP substrate 1 (100).

In the p-InP spacer 4, a p-InGaAsP diffraction grating 13 which is extended by 100 $\mu$m from an emitting-side reflecting film 15 and has a film thickness of 20 nm is formed periodically at a pitch of about 220 nm to select laser light having a center wavelength of 1.48 $\mu$m.

The p-InP spacer later 4 containing this diffraction grating 13, the GRIN-SCH-MQW active layer 3 and the upper portion of the n-InP buffer layer 2 are processed into a mesa-stripe form and both sides of the mesa-stripe are filled with a p-InP blocking layer 8 and an n-InP blocking layer 9 which are formed as current blocking layers. Also, a positive electrode 10 is formed on the top surface of the InGaAsP cap layer 7 and a negative electrode 11 is formed on the backface of the n-InP substrate 1.

A reflecting film 14 having a light reflection factor as high as 80% or more is formed on the light reflecting facet (i.e. a facet at which light is reflected) which is one end surface in the direction of the long side of the semiconductor laser element 20 and an emitting-side reflecting film 15 having a light reflection factor as low as 2% or less and preferably 0.1% or less is formed on a light emitting facet (i.e. a facet from where light is emitted) which is the other facet. The light generated in the GRIN-SCH-MQW active layer 3 which is a light resonant cavity formed by the reflecting film 14 and the emitting-side reflecting film 15 is reflected by the reflecting film 14 and emitted as laser light through the emitting-side reflecting film 15.

In this semiconductor laser element 20, the diffraction grating 13 is disposed in the vicinity of the GRIN-SCH-MQW active layer 3 on the side of the emitting-side reflecting film 15 and a plurality of oscillation longitudinal modes can be thereby obtained in an oscillation wavelength spectrum. Therefore, when the semiconductor laser element 20 is used for an exciting light source for a Raman amplifier, stimulated Brillouin scattering is not generated and a stable and high Raman gain can be obtained. Although the material of the diffraction grating 13 is shown in FIGS. 2 and 3 as not contacting the emitting side reflecting film 15, the present inventors have discovered that the grating material is preferably made to contact the emitting side reflecting film 15. This provides a more stable light output from the device 20 because the existence of kinks in the I-L curve depends on the distance of the diffraction grating material from the light emitting facet of the semiconductor laser device.

As seen in FIG. 3, a distance between the end of the grating material and the facet 15 is designated as X. The present inventors have discovered that where X is a nonzero value (i.e. the grating material is not in contact with the facet 15), multiple reflections occur between the facet 15 and the grating material of the grating 13 causing undesirable kinks in the IL curve of the laser device. Such kinks are readily identified by the use of a slope efficiency curve of the laser device, which results from the first-order differential operation carried out on the I-L curve of the device.

As seen in FIG. 3A, a device having the diffraction grating in contact with the light emitting facet (i.e., X=0 has only one small kink occurring only at low driving currents. However, as seen in FIGS. 3B and 3C, increasing the distance of the grating material from the light emitting facet will produce larger and more frequent kinks resulting in inefficient operation of the laser device. Thus, the present inventors have recognized that placing the grating material in contact with the light emitting facet results in more efficient operation of the laser device.

It is to be noted that each of the semiconductor laser elements LD1 and LD2 constituting the group LD of semiconductor laser elements is arranged as the semiconductor wafer W with a structure excluding the reflecting film 14 and emitting-side reflecting film 15 of the semiconductor laser element 20.

As mentioned above, the group LD of semiconductor laser elements is formed on the semiconductor wafer W by using semiconductor process technologies. In this case, the diffraction grating G is formed in the group LD of semiconductor laser elements. This diffraction grating G corresponds to two diffraction gratings 13 of the semiconductor laser element 20 shown in FIG. 3. Namely, two diffraction gratings 13 are arranged opposite to each other on the semiconductor wafer W and formed as one diffraction grating G in the semiconductor process. Accordingly, each semiconductor laser element is formed in such a manner that it is successively arranged longitudinally in the direction of the long side, wherein the emitting-side reflecting films 15 are adjacent among them and the reflecting films 14 are adjacent among them. Also, each semiconductor laser element is arranged matrix-wise such that the long-side surfaces are adjacent to each other.

Figure 5A:
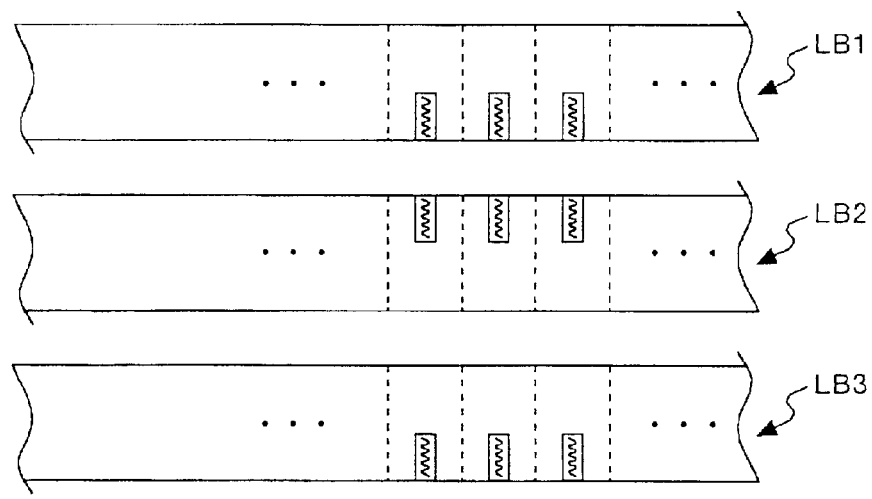
FIG. 5A to FIG. 5D are views showing how semiconductor laser elements are manufactured from the semiconductor wafer shown in FIG. 1.
Figure 5B:
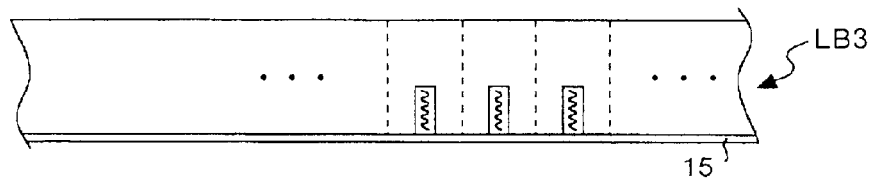
Figure 5C:
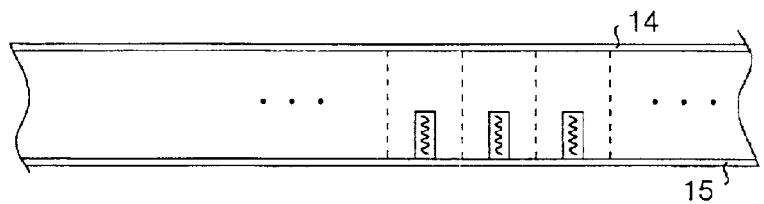
Figure 5D:
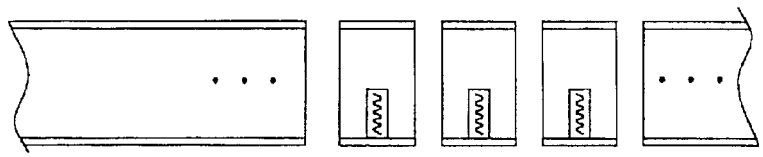

After that, as shown in FIG. 5A to FIG. 5D, first the semiconductor wafer is cleft along cleavage planes C11 to C14 to form laser bars LB1 to LB3 (see FIG. 5A). Further, each cleavage plane of the laser bars LB1 to LB3 is coated to form the emitting-side reflecting film 15 (see FIG. 5B) and the reflecting film 14 is further formed (see FIG. 5C).

Figure 6:
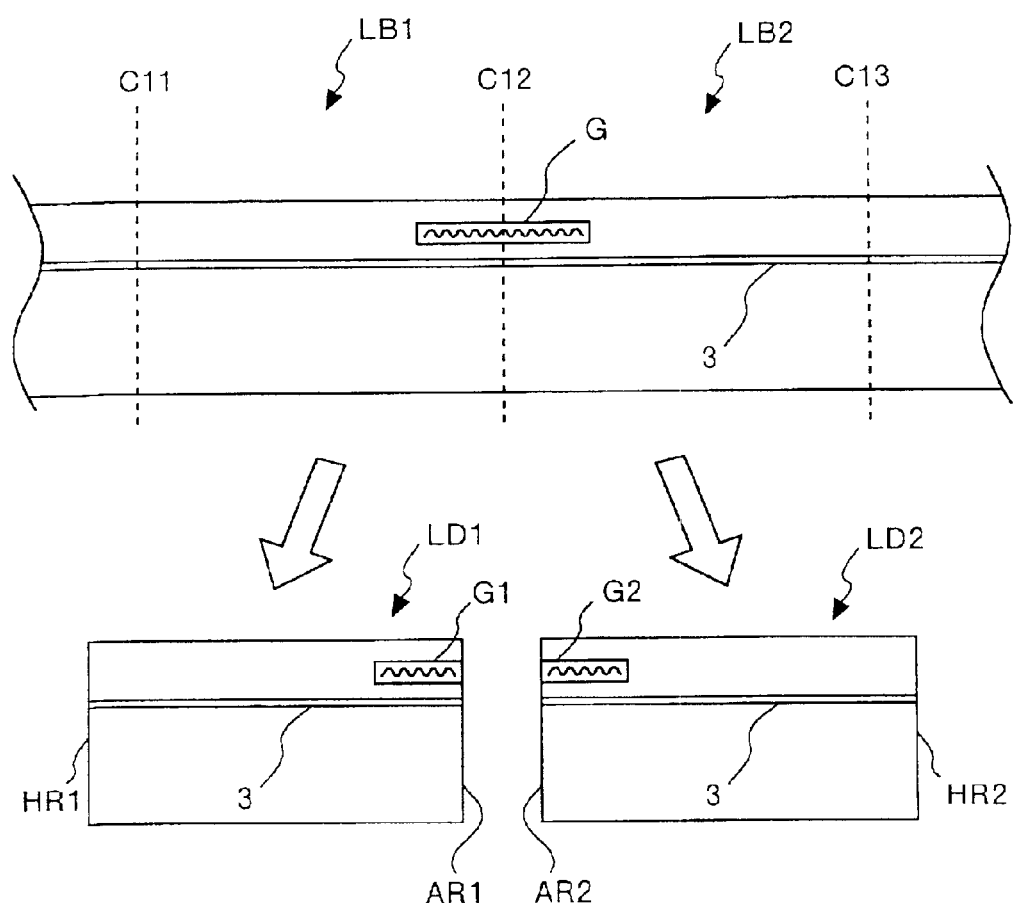
FIG. 6 is a sectional view showing the state of a laser bar before and after cleavage for cutting out semiconductor laser elements from the laser bar.

Thereafter, the laser bars LB1 to LB3 on which the emitting-side reflecting film 15 and the reflecting film 14 are formed are cleft every each of laser bars LB1 to LB3 corresponding to cleavage planes C21 to C24 to cut out final semiconductor laser elements (see FIG. 5D); for example, the semiconductor laser elements LD1 and LD2 shown in FIG. 6.

FIG. 6 is a view showing a section along the line A—A corresponding to the cleavage plane C22 prior to the cleavage of the laser bars LB1 and LB2 and the section after the cleavage. As shown in FIG. 5A to FIG. 5D, the laser bar LB1 is cut out by the cleavage of the cleavage planes C11 and C12 and the laser bar LB2 is cut out by the cleavage of the cleavage planes C12 and C13. Here, the cleavage plane C11 forms at least a reflecting surface HR1 of each semiconductor laser element forming the laser bar LB1. Also, the cleavage plane C12 forms an emitting surface AR1 of the laser bar LB1 and forms a reflecting surface AR2 of the laser bar LB2 at the same is time. Further, the cleavage plane C13 forms at least an emitting surface HR2 of the laser bar LB2.

As a result, in the semiconductor laser element LD1 in the laser bar LB1, the diffraction grating G1 is formed on the side of the emitting surface AR1 and in the semiconductor laser element LD2 in the laser bar LB2, the diffraction grating G2 is formed on the side of the emitting surface AR2. The position of each of the diffraction gratings G1 and G2 is aligned with high accuracy on the basis of a pattern of a mask aligner aligned based on an orientation flat OF by using semiconductor process technologies. On the other hand, the cleavage planes C11 to C14 and C21 to C24 are also cleft one after another by a scriber after scratches are formed at positions corresponding to the cleavage planes C11 to C14 on a part of the semiconductor substrate 1 by using a diamond cutter.

The diffraction grating G is formed into an integrated one as a diffraction grating of the semiconductor laser elements LD1 and LD2 and formed as one continuous diffraction grating. Therefore, even if the cleavage plane C12 is cleft in the condition that its position is shifted, the diffraction gratings G1 and G2 are not formed at positions far apart from the side of the emitting surfaces AR1 and AR2 of each of the semiconductor laser elements LD1 and LD2 and no diffraction grating is formed on the side of the reflecting surfaces HR1 and HR2. For this reason, a semiconductor laser element which keeps original functions expected from the diffraction gratings G1 and G2 which have been designed can be manufactured with high possibility, whereby a reduction in yield can be prevented. That is, a higher yield of devices manufactured will have a diffraction grating in contact with a facet (either light emitting or light reflecting) of the laser device.

In the first embodiment, the structure in which a diffraction grating is disposed on the side of the emitting surface. The present invention is not limited to this structure and may be applied to a structure in which a diffraction grating is formed only on the side of the reflecting surface and also to a structure in which a diffraction plating is formed on both the side of the emitting surface and the side of the reflecting surface. Even in the case of forming on both the side of the emitting surface and the side of the reflecting surface, these emitting surfaces and reflecting surfaces are arranged opposite to each other among them respectively to form each semiconductor laser element. This is because the diffraction grating to be formed on the side of the emitting surface and the diffraction grating to be formed on the side of the reflecting surface respectively differ in length and coupling factor frequently.

Next, a second embodiment of the present invention will be explained. In the first embodiment, a method of manufacturing a semiconductor laser element in which the diffraction grating 13 is formed along the GRIN-SCH-MQW active layer 3 is explained. In the second embodiment, on the other hand, a method of manufacturing a semiconductor laser element having a structure in which a light waveguide 30 is formed adjacent to the GRIN-SCH-MQW active layer 3 and diffraction gratings are formed on the side of the emitting surface along this light waveguide 30.

Figure 7:
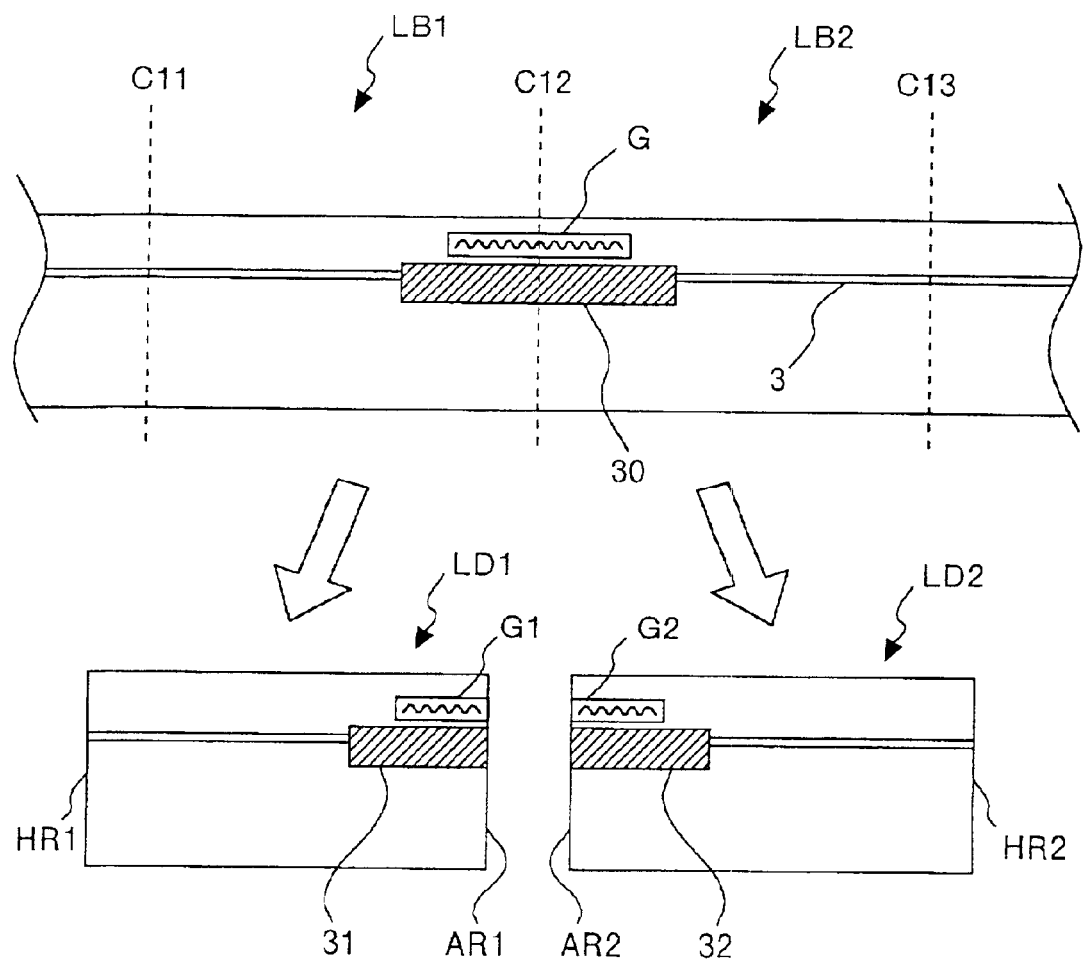
FIG. 7 is a sectional view showing the state of a laser bar before and after cleavage for cutting out semiconductor laser elements of the second embodiment of this invention from the laser bar.

FIG. 7 is a sectional view showing the states of laser bars LB1 and LB2 before and after cleavage in the method of manufacturing a semiconductor laser element of the second embodiment of this invention. In FIG. 7, light waveguides 31 and 32 and diffraction gratings G1 and G2 to be formed on the side of the emitting surface are formed respectively as one light waveguide 30 and as one diffraction grating G. After that, the laser bar LB1 is cut out by the cleavage of the cleavage planes C11 and C12 and the laser bar LB2 is cut out by the cleavage of cleavage planes C12 and C13 in the same manner as in the first embodiment. Here, the cleavage plane C11 forms at least a reflecting surface HR1 of each semiconductor laser element forming the laser bar LB1. Also, the cleavage plane C12 forms an emitting surface AR1 of the laser bar LB1 and forms a reflecting surface AR2 of the laser bar LB2 at the same time. Further, the cleavage plane C13 forms at least an emitting surface HR2 of the laser bar LB2.

Here, the diffraction grating G is formed into an integrated one as a diffraction grating of the semiconductor laser elements LD1 and LD2 and formed as one continuous diffraction grating. Therefore, even if the cleavage plane C12 is cleft in the condition that its position is shifted, the diffraction gratings G1 and G2 are not formed at positions far apart from the side of the emitting surfaces AR1 and AR2 of each of the semiconductor laser elements LD1 and LD2 and no diffraction grating is formed on the side of the reflecting surfaces HR1 and HR2. For this reason, a semiconductor laser element which keeps original functions expected from the diffraction gratings G1 and G2 which have been designed can be manufactured with high possibility, whereby a reduction in yield can be prevented.

Next, a third embodiment of this invention will be explained. In the first and second embodiments, explanations are given as to the method of manufacturing a semiconductor laser element as a laser light source. In the third embodiment, a method of manufacturing a semiconductor laser element provided also with a light modulator for light-modulating laser light will be explained.

Figure 8:
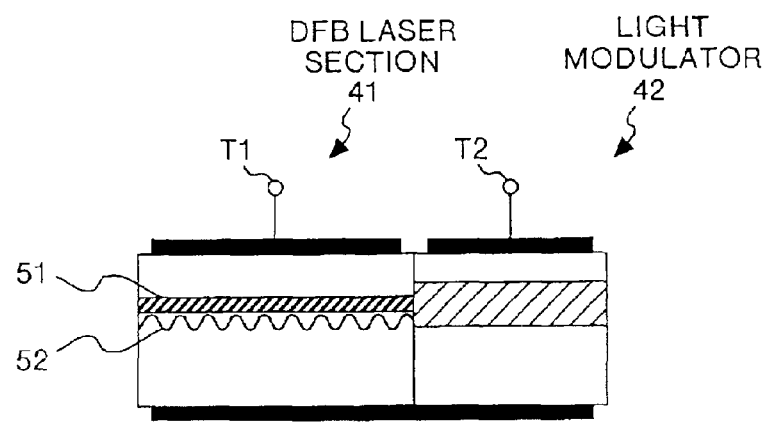
FIG. 8 is a longitudinal sectional view of a semiconductor laser element of the third embodiment of this invention.

FIG. 8 is a longitudinal sectional view showing the outline of the structure of a semiconductor laser element manufactured using a method according to the third embodiment of this invention. This semiconductor laser element is provided with a DFB laser section 41 and a light modulator 42. The DFB laser section 41 is provided with a diffraction grating 52 along an active layer 51 to output laser light having a desired oscillating wavelength based on the wavelength selective characteristics of the diffraction grating 52.

The light modulator 42 is arranged at a position adjacent to the side of the emitting surface of the DFB laser section 41. The light modulator 42 is an EA (Electro Absorption) type light modulator. The light modulator 42 changes absorption coefficient due to an electric field applied from a terminal T2 to attain modulation by turning on or off the laser light output from the DFB laser section 41. In this case, a terminal T1 is a terminal which injects current into the DFB laser section 41.

Even the semiconductor laser element shown in FIG. 8 has a structure, such as a diffraction grating 52, common to each semiconductor laser element on one end of the longitudinal direction. Therefore, each semiconductor laser element is formed in the condition that one ends having this common structure are arranged at positions adjacent to each other, whereby a reduction in the yield of each semiconductor laser element can be prevented.

Figure 9:
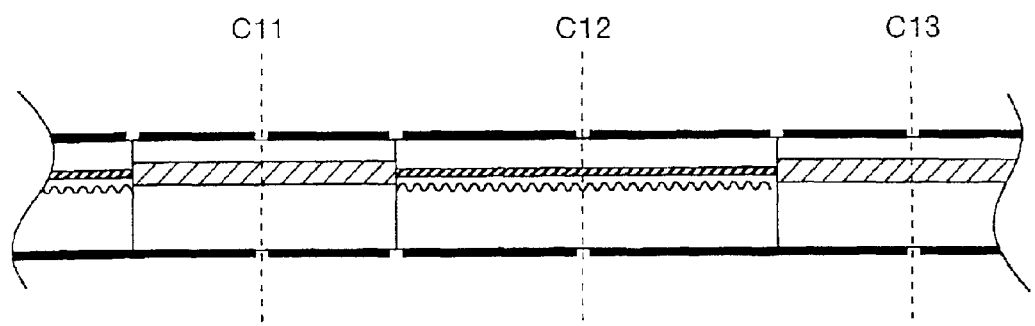
FIG. 9 is a sectional view showing the state of a laser bar before and after cleavage for cutting out semiconductor laser elements shown in FIG. 8 from the laser bar.

FIG. 9 is a sectional view showing the states of the laser bars LB1 and LB2 before and after the cleavage in the method of manufacturing a semiconductor laser element in the third embodiment of this invention. In FIG. 9, the emitting surface sides of the light modulators 42 and the reflecting surface sides of the DFB laser section 41 are respectively arranged at positions adjacent to each other. Therefore, even if the misregistration of the cleavage plane C12 is produced, the diffraction grating 52 is not formed on the side of the emitting surface of the light modulator 42.

It is to be noted that in the third embodiment, the semiconductor laser element in which the light modulator 42 is joined adjacently with the DFB laser section 41 is explained. The semiconductor laser element is not limited to this and an amplifier section (not shown) may be joined adjacently with the DFB laser section 41. Also, the DFB laser section 41 is a DFB type semiconductor laser, but is not limited to this type and may be a DBR type semiconductor laser. Further, the DFB laser section 41 is designed to be provided with the diffraction grating 52 on the entire surface along the active layer 51; however, a structure in which a diffraction grating is formed in part may be adopted. For example, a structure in which a diffraction grating is formed on the side of the reflecting surface may be adopted.

Next, a fourth embodiment according to this invention will be explained. In all of the first to third embodiments, diffraction gratings, light waveguides and DFB laser sections are designed to be arranged opposite to each other on the semiconductor wafer W. On the other hand, in the fourth embodiment, common structures such as a diffraction grating are arranged in the same direction in the same way as in conventional structures and an allowance zone is provided between each semiconductor laser element.

Figure 10:
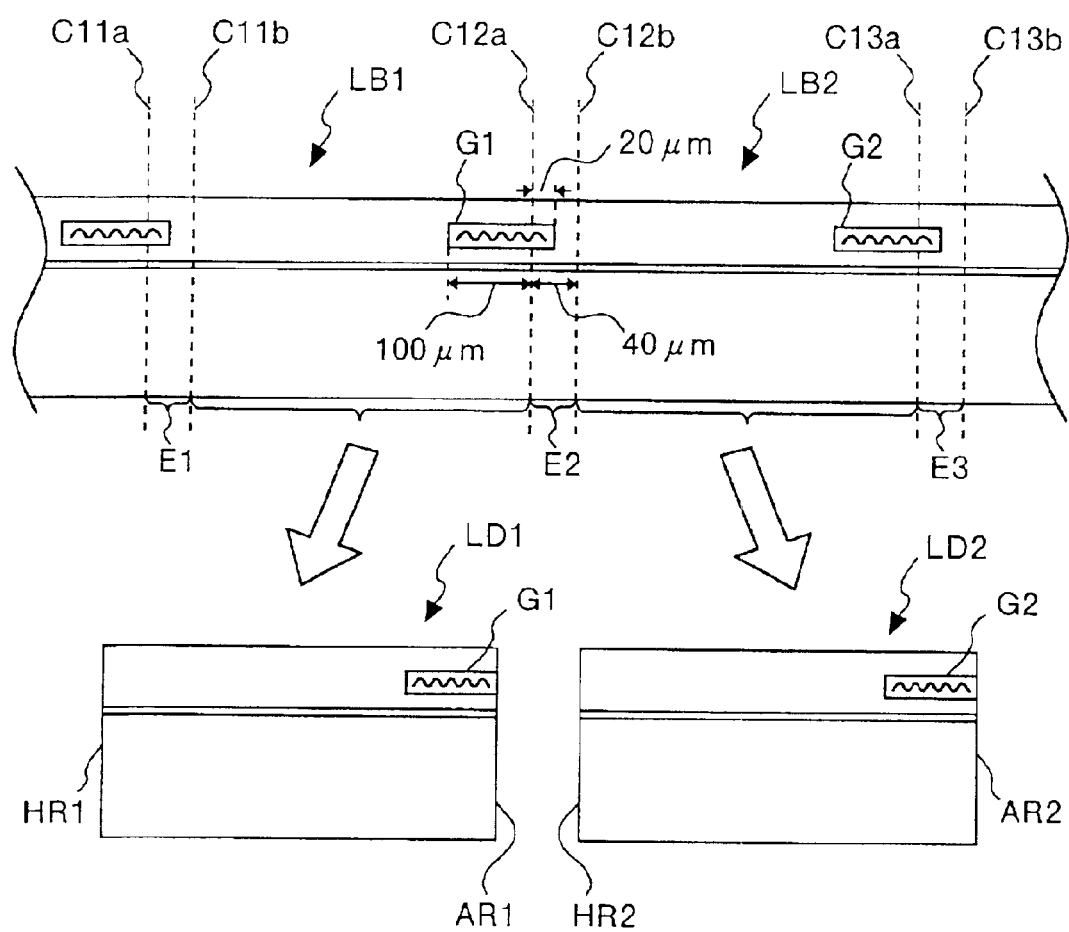
FIG. 10 is a sectional view showing the state of a laser bar before and after cleavage for cutting out semiconductor laser elements of the fourth embodiment of this invention from the laser bar.
Figure 11:
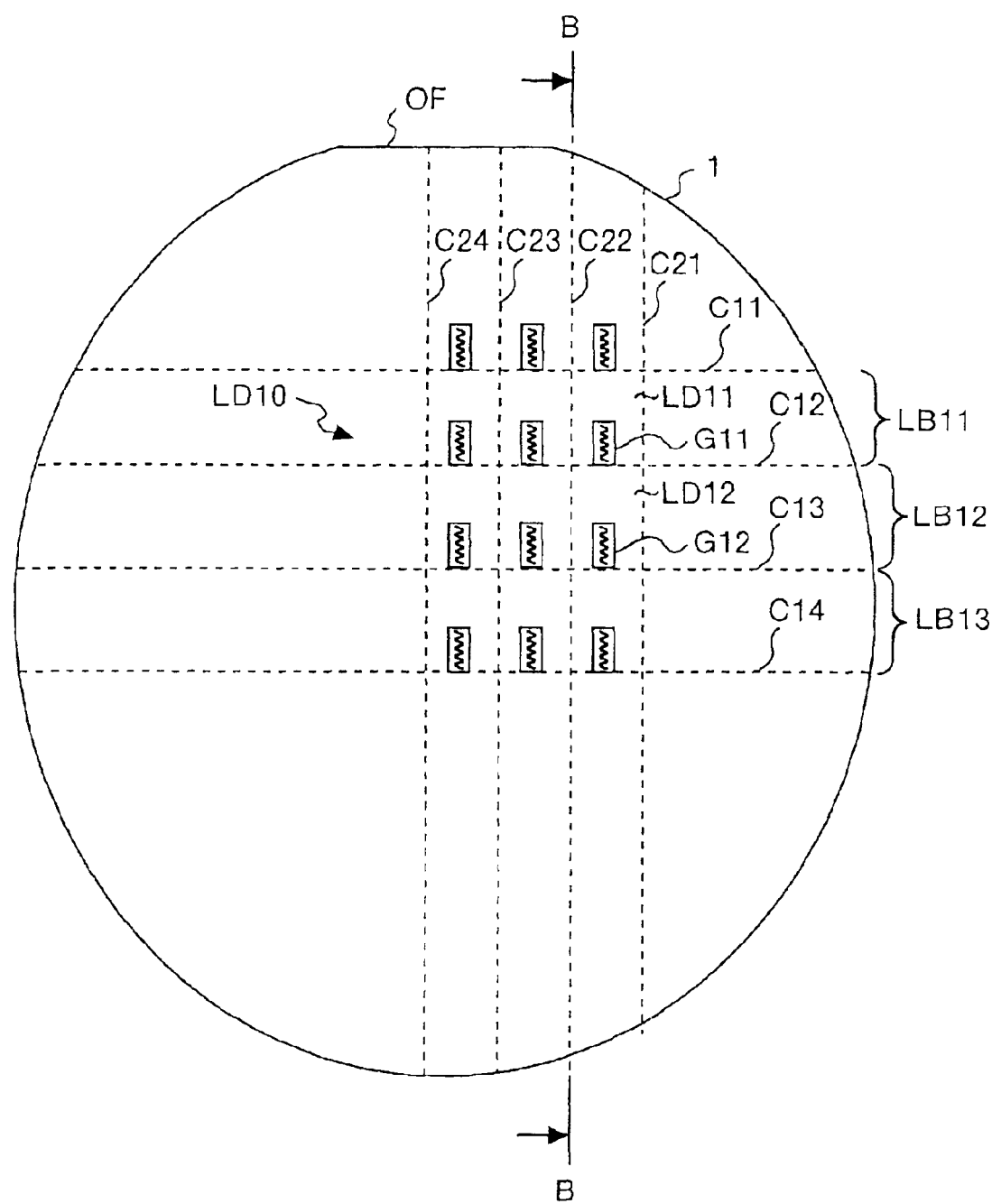
FIG. 11 is a top plan view of a semiconductor wafer on which conventional semiconductor laser elements are formed.
Figure 12:
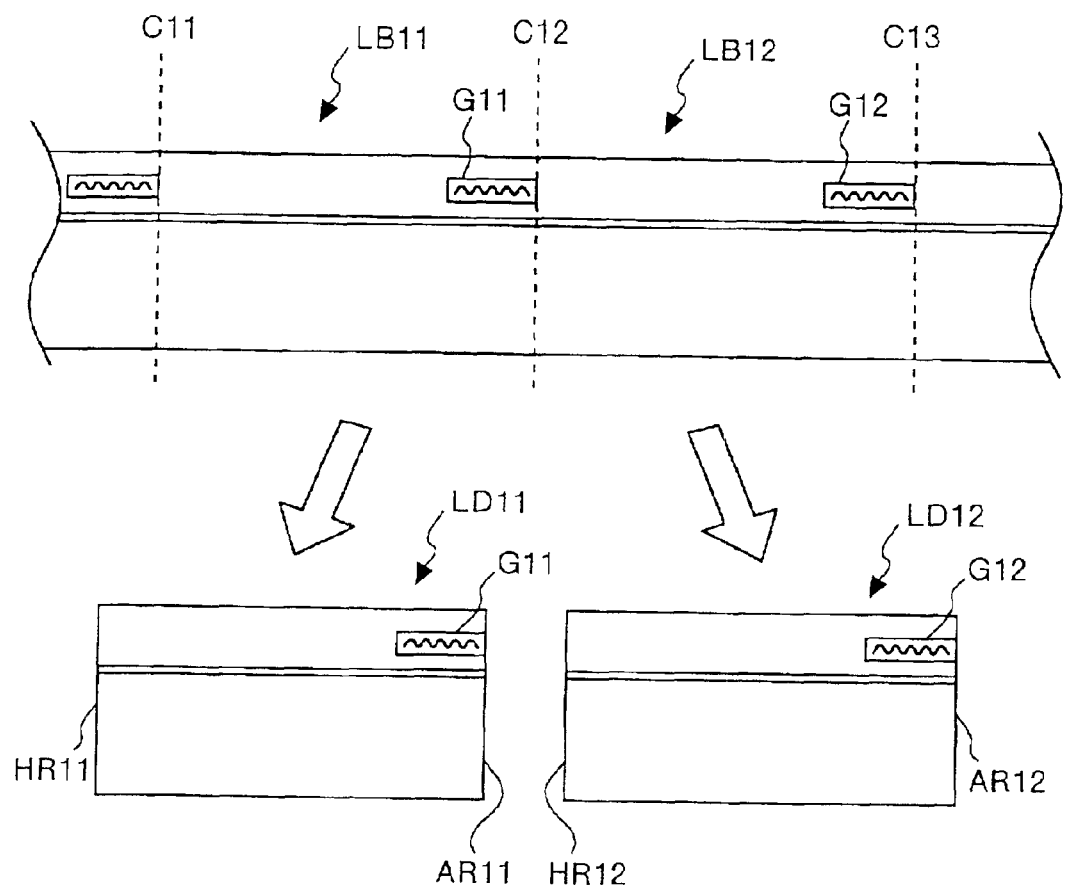
FIG. 12 is a sectional view showing the state of a laser bar before and after cleavage for cutting out semiconductor laser elements from the laser bar by a conventional method.
Figure 13:
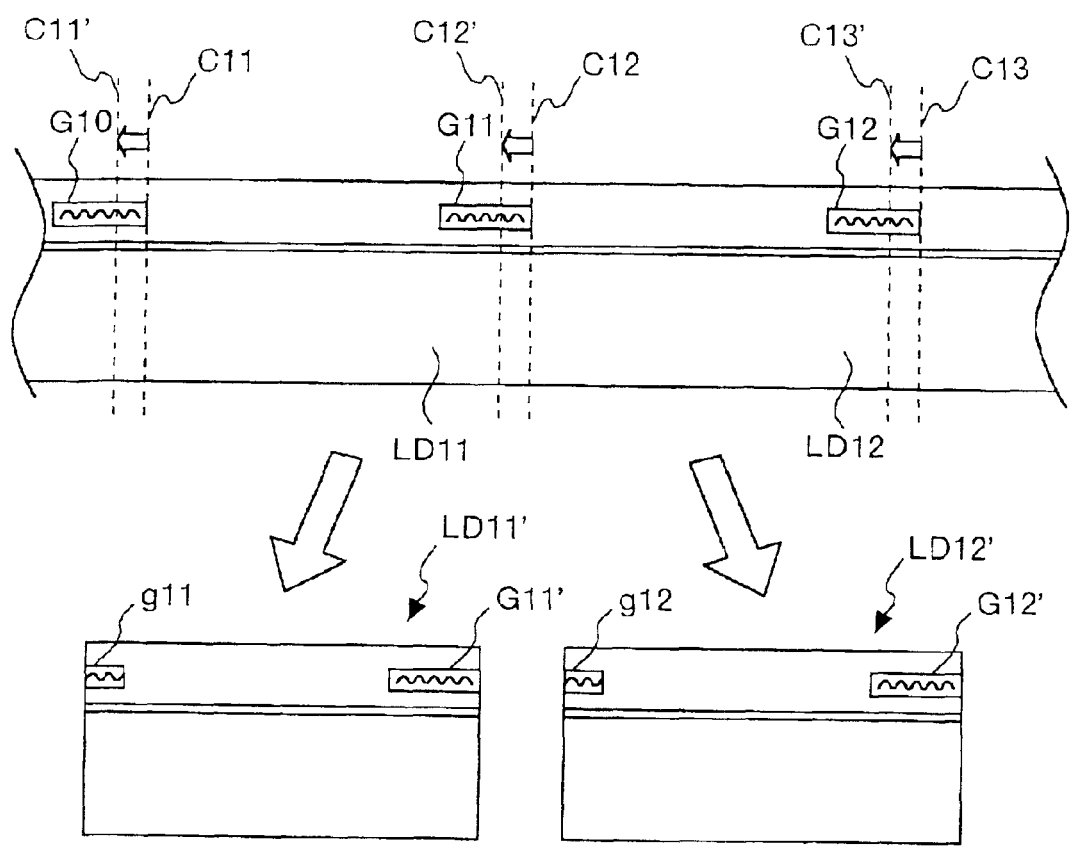
FIG. 13 is a sectional view showing another state of a laser bar before and after cleavage for cutting out semiconductor laser elements from the laser bar by a conventional method.
Figure 14:
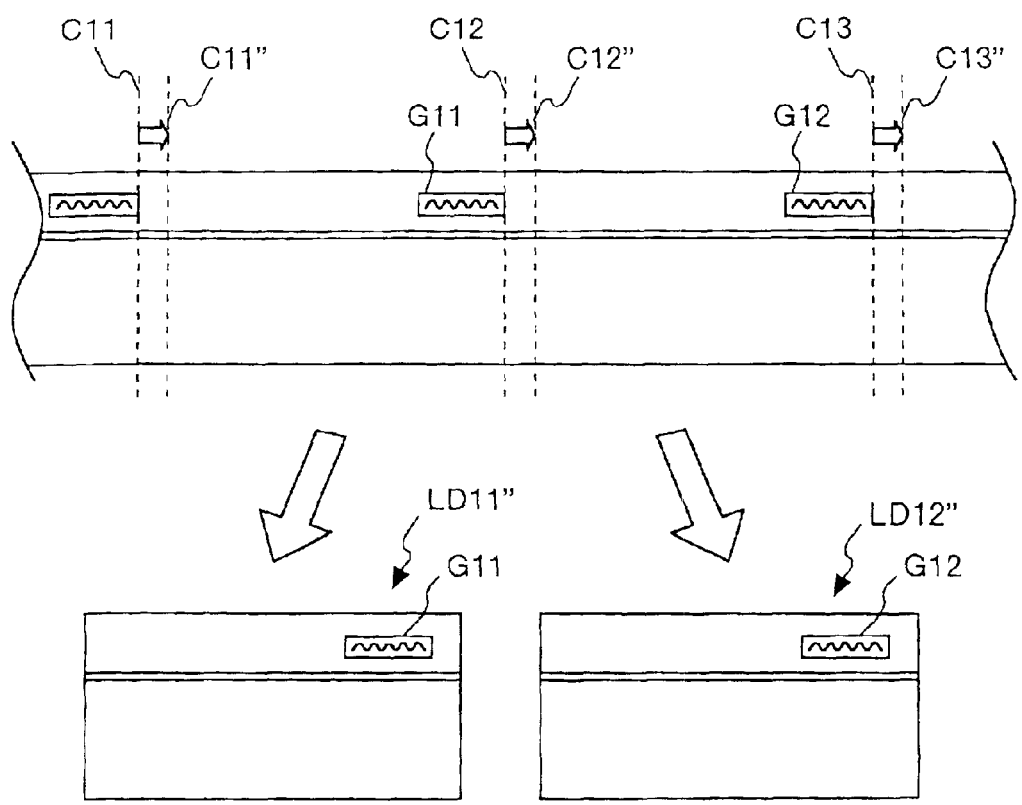
FIG. 14 is a sectional view showing a further state of a laser bar before and after cleavage for cutting out semiconductor laser elements from the laser bar by a conventional method.

FIG. 10 is a longitudinal section showing the outline of the structure of a semiconductor laser element manufactured using the method according to the fourth embodiment of this invention. In FIG. 10, diffraction gratings G1 and G2 of each semiconductor laser element are not arranged opposite to each other, but arranged respectively in the same direction in the same manner as in conventional structures. Allowance zones E1 to E3 are provided between each laser bar. For example, the allowance zone E2 is provided between laser bars LB1 and LB2. In the fourth embodiment, two cleavage planes each, namely C11a and C11b, C12a and C12b and C13a and C13b corresponding to cleavage planes C11 to C13 are respectively formed in association with the provision of the allowance zones E1 to E3.

The length required for the diffraction grating G1 is 100 μm and the error of cleavage position is ±10 μm. For this reason, the diffraction grating G1 is formed extendedly in the allowance zone E2 by about 20 μm from the cleavage plane C12a of the side of the laser bar LB1. Also, the structure in the vicinity of the cleavage plane C12b of the laser bar LB2 is formed extendedly in the allowance zone E2 by about 20 μm from the cleavage plane C12b of the side of the laser bar LB2. Therefore, the width of the allowance zone E2 is 40 μm resultantly.

The error of the cleavage position is ±10 μm. Therefore, even if the error of the cleavage position of the cleavage plane C12a is produced, the diffraction grating G1 extending to the reflecting surface AR1 which is the actual position of the cleavage plane of the cleft laser bar LB1 is surely formed. On the other hand, even if the error of the cleavage position of the cleavage plane C12b is produced, the diffraction grating G1 is not formed but the structure in the vicinity of the cleavage plane C12b of the laser bar LB2 is surely formed on the reflecting surface HR2 which is the actual cleavage position of the cleft laser bar LB2. In this case, when the error of the cleavage position is ±10 μm, it is only required for the width of the allowance zone E2 to exceeds at least 20 μm. However, in FIG. 10, the width is designed to be 40 μm with a margin.

In the fourth embodiment, the allowance zone is provided and even if the error of the cleavage position within an allowable error of cleavage position is produced, the same facet structure as in the case where no error of the cleavage position is produced can be obtained whereby a reduction in the yield of the semiconductor laser element can be prevented. Thus, as with the first embodiment of the invention, a higher yield of devices manufactured will have a diffraction grating in contact with a facet (either light emitting or light reflecting) of the laser device.

As explained above, according to the present invention, in the step of forming a common structure, the common structure provided at one end of each semiconductor element group is arranged opposite to each other to thereby form each common structure of the semiconductor elements disposed opposite to each other as a united one common structure. Thus, two common structures arranged opposite to each other are formed as one common structure. If positional errors are produced when this one common structure is divided into two common structures by cleavage, this common structure is not formed at the other end, thereby producing the effect of being capable of preventing a reduction in the yield of each semiconductor.

Furthermore, when a group of semiconductor elements having a common structure at one end of each semiconductor element is formed collectively on a semiconductor substrate by using semiconductor process technologies, a step of forming an allowance is carried out. By the step of forming an allowance, one end of each semiconductor element, which end is provided with the common structure, is arranged in the same direction and an allowance zone is formed, the allowance zone being disposed between the arranged one end of the semiconductor element and the other end of a semiconductor element adjacent to the one end and prepared by extending at least the common structure by a width corresponding to a cutting error of the edge of the one end from the one end and by extending at least the structure of the other end by a width corresponding to a cutting error of the edge of the other end from the other end. Even if cutting errors are produced respectively at the edge of one end and at the edge of the other end, the common structure is formed on one end without a break and also, a part of the common structure is not formed on the other end, thereby producing the effect of being capable of preventing a reduction in the yield of each semiconductor.

Moreover, when semiconductor laser elements having a diffraction grating formed partly on the side of the laser light emitting facet are formed collectively on a semiconductor substrate by using semiconductor process technologies, a step of forming a diffraction grating is carried out. In the step of forming a diffraction grating, the light emitting facets provided with the diffraction grating are arranged opposite to each other to thereby form each diffraction grating of the semiconductor laser elements disposed opposite to each other as a united one diffraction grating. Thus, two diffraction gratings arranged opposite to each other are formed as one diffraction grating. If positional errors are produced when this one diffraction grating structure is divided into two diffraction gratings by cleavage, this diffraction grating is not formed at the other end. Also, the diffraction grating is not arranged apart from the emitting end, thereby producing the effect of being capable of preventing a reduction in the yield of each semiconductor.

Furthermore, when semiconductor laser elements having a diffraction grating formed partly on the side of the laser light reflecting facet are formed collectively on a semiconductor substrate by using semiconductor process technologies, a step of forming a diffraction grating is carried out. In the step of forming a diffraction grating, the light reflecting facets provided with the diffraction grating are arranged opposite to each other to thereby form each diffraction grating of the semiconductor laser elements disposed opposite to each other as a united one diffraction grating. Thus, two diffraction gratings arranged opposite to each other are formed as one diffraction grating. If positional errors are produced when this each one diffraction grating structure is divided into two diffraction gratings by cleavage, this diffraction grating is not formed at the other end. Also, the diffraction grating is not arranged apart from the light reflecting facet, thereby producing the effect of being capable of preventing a reduction in the yield of each semiconductor.

Moreover, when semiconductor laser elements having diffraction gratings formed partly on both the side of the laser light reflecting facet and the side of the laser light reflecting facet are formed collectively on a semiconductor substrate by using semiconductor process technologies, a step of forming a diffraction grating is carried out. In the step of forming a diffraction grating, the light emitting facets and light reflecting facets provided with the diffraction grating are arranged opposite to each other among the light emitting facets and among the light reflecting facets respectively to thereby form each diffraction grating of the semiconductor laser elements disposed opposite to each other as a united one diffraction grating. Thus, two diffraction gratings arranged opposite to each other are formed as one diffraction grating. If positional errors are produced when this one diffraction grating structure is divided into two diffraction gratings by cleavage, this diffraction grating is not formed at the other end, thereby producing the effect of being capable of preventing a reduction in the yield of each semiconductor.

Furthermore, each semiconductor element which is formed collectively on the semiconductor substrate is separated and cut into each semiconductor element which is formed collectively thereby producing a final individual semiconductor element, thereby producing the effect of being capable of preventing a reduction in the yield of each semiconductor produced finally.

Moreover, each semiconductor element is arranged such that the opposite paired semiconductor laser elements are successively arranged longitudinally one by one in the direction of the long side of the semiconductor laser element and the long side surfaces of the semiconductor laser elements are arranged at positions adjacent to each other. Thus each semiconductor laser element is arranged matrix-wise on the semiconductor substrate, thereby producing the effect of enabling a rise in production efficiency and an improvement in yield.

Furthermore, the first separating step in the separating step serves to separate a laser bar which is a series of a group of semiconductor laser elements arranged such that the long side surfaces of each semiconductor laser element are adjacent to each other and the reflecting film-forming step serves to form a predetermined reflection film on the cleavage plane of the laser bar separated in the first separating step, thereby producing the effect of enabling a rise in production efficiency and an improvement in yield.

Moreover, the semiconductor laser element is arranged such that the diffraction grating is disposed along an active layer. Even a semiconductor laser element in which oscillating wavelength is selected by this diffraction grating can be produced without almost changing the qualitative characteristics of this diffraction grating, thereby producing the effect of being capable of preventing a reduction in yield.

Furthermore, even a semiconductor laser element arranged such that the diffraction grating is disposed along a light waveguide layer adjacent to an active layer can be produced without almost changing the qualitative characteristics of this diffraction grating, thereby producing the effect of being capable of preventing a reduction in yield.

Moreover, even a semiconductor laser element which is further provided with a modulator section formed to modulate laser light and/or an amplifier section formed to amplify laser light can be manufactured without changing original functions expected from these diffraction grating, modulator section and/or amplifier section when these parts are designed, thereby producing the effect of being capable of preventing a reduction in yield.

Furthermore, a semiconductor element is manufactured using the method as claimed in any one of claims 1 to 11 and therefore the effect of being able to obtain a semiconductor element having working effects shown in claims 1 to 11.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor laser element comprising:
    forming a plurality of semiconductor laser elements on a semiconductor wafer such that two adjacent semiconductor laser elements define a separation boundary, the separation boundary being a light emitting facet for each of the two adjacent semiconductor laser elements; and
    forming a diffraction grating across said separation boundary such that said diffraction grating is common to said two adjacent semiconductor elements formed on said semiconductor wafer; and
    physically separating the two adjacent semiconductor laser elements approximately at said separation boundary to form discrete semiconductor laser elements each having a portion of said diffraction grating.

2. The method of claim 1, wherein said forming a diffraction grating comprises forming one of a distributed feedback (DFB) grating and a distributed Bragg reflector (DBR) grating.

3. The method of claim 1, wherein said physically separating comprises cleaving the two adjacent semiconductor laser elements at said separation boundary.

4. The method of claim 3, further comprising forming a reflective coating on a cleavage plane of a discrete semiconductor laser element formed by said cleaving.

5. The method of manufacturing a semiconductor laser element comprising:
    forming a plurality of semiconductor laser elements on a semiconductor wafer such that two adjacent semiconductor laser elements define a separation boundary, the separation boundary being a light emitting facet for each of the two adjacent semiconductor laser elements; and
    forming a diffraction grating across said separation boundary such that said diffraction grating is common to said two adjacent semiconductor elements formed on said semiconductor wafer; and
    physically separating the two adjacent semiconductor laser elements approximately at said separation boundary to form discrete semiconductor laser elements each having a portion of said diffraction grating.

6. The method of claim 5, wherein said forming a diffraction grating comprises forming one of a distributed feedback (DFB) grating and a distributed Bragg reflector (DBR) grating.

7. The method of claim 5, wherein said physically separating comprises cleaving the two adjacent semiconductor laser elements at said separation boundary.

8. The method of claim 7, further comprising forming a reflective coating on a cleavage plane of a discrete semiconductor laser element formed by said cleaving.

* * * * *